US008628715B2

(12) United States Patent
Kakui et al.

(10) Patent No.: US 8,628,715 B2
(45) Date of Patent: Jan. 14, 2014

(54) LASER PROCESSING METHOD AND LASER PROCESSING DEVICE

(75) Inventors: Motoki Kakui, Yokohama (JP); Kazuo Nakamae, Yokohama (JP); Shinobu Tamaoki, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 234 days.

(21) Appl. No.: 13/059,592

(22) PCT Filed: Oct. 23, 2009

(86) PCT No.: PCT/JP2009/068240
§ 371 (c)(1),
(2), (4) Date: Feb. 17, 2011

(87) PCT Pub. No.: WO2010/047384
PCT Pub. Date: Apr. 29, 2010

(65) Prior Publication Data
US 2011/0148002 A1 Jun. 23, 2011

(30) Foreign Application Priority Data
Oct. 23, 2008 (JP) ................. 2008-273341

(51) Int. Cl.
*B29C 35/08* (2006.01)
(52) U.S. Cl.
USPC .... 264/400; 264/493; 425/174.4; 219/121.69
(58) Field of Classification Search
USPC .......... 264/400, 493; 425/174.4; 219/121.74, 219/121.69
See application file for complete search history.

(56) References Cited

U.S. PATENT DOCUMENTS

| 5,593,606 A | 1/1997 | Owen et al. |
| 5,656,186 A | 8/1997 | Mourou et al. |
| 5,777,342 A * | 7/1998 | Baer ......................... 250/492.2 |
| 6,531,677 B2 | 3/2003 | Arai et al. |
| 2003/0000927 A1 | 1/2003 | Kanaya et al. |

(Continued)

FOREIGN PATENT DOCUMENTS

| JP | 10-341069 A | 12/1998 |
| JP | 2002-035976 A | 2/2002 |

(Continued)

OTHER PUBLICATIONS

Office Action in Chinese Patent Application No. 200980142278.X dated May 15, 2013.

(Continued)

*Primary Examiner* — Joseph S Del Sole
*Assistant Examiner* — Nahida Sultana
(74) *Attorney, Agent, or Firm* — Venable LLP; Michael A. Sartori; Tamatane J. Aga

(57) ABSTRACT

The present invention relates to a laser processing method and the like which use no wavelength conversion technique by nonlinear optical crystals when selectively removing an insulating layer of a printed board, while employing only one wavelength throughout the entire removal processing. A laser processing apparatus (1), preferably used in the laser processing method, has a MOPA structure and comprises a seed light source (100), a YbDF (110), a bandpass filter (120), a YbDF (130), a bandpass filter (140), a YbDF (150), a YbDF (160), and so forth. The laser processing method according to the present invention is a laser processing method of removing an insulating layer comprised of a resin laminated on a conductor layer by irradiating it with pulsed laser light outputted from the laser processing apparatus (1) and uses laser light having a wavelength at which the light absorbed by the conductor layer is less than 10%, and sets the fluence per one pulse to a fracture damage threshold of the insulating layer or higher.

20 Claims, 20 Drawing Sheets

(56) References Cited

U.S. PATENT DOCUMENTS

| | | | |
|---|---|---|---|
| 2008/0290563 A1* | 11/2008 | Nowak et al. | 264/400 |
| 2009/0239042 A1* | 9/2009 | Jain et al. | 428/195.1 |
| 2010/0215063 A1* | 8/2010 | Gao et al. | 372/11 |
| 2011/0042353 A1* | 2/2011 | Menoni et al. | 216/66 |
| 2011/0057356 A1* | 3/2011 | Jow | 264/400 |
| 2012/0018993 A1* | 1/2012 | Boegli et al. | 283/74 |
| 2012/0237731 A1* | 9/2012 | Boegli et al. | 428/156 |
| 2012/0273472 A1* | 11/2012 | Unrath et al. | 219/121.73 |

FOREIGN PATENT DOCUMENTS

| | | |
|---|---|---|
| JP | 2002-118344 A | 4/2002 |
| JP | 2003-001464 A | 1/2003 |
| JP | 2003-260579 A | 9/2003 |
| JP | 2004-351513 A | 12/2004 |
| JP | 2005-342749 A | 12/2005 |
| JP | 3824522 A | 9/2006 |
| JP | 2008-211084 A | 9/2008 |

OTHER PUBLICATIONS

Office Action in Chinese Patent Application No. 2013051000648020 dated May 15, 2013.

Office Action issued in Japanese Patent Application No. 2009-243683 dated Aug. 27, 2013.

* cited by examiner (a)

| REPETITION FREQUENCY (kHz) | PULSE WIDTH (ns) | FLUENCE (J/cm²) | MAX IRRADIATION INTENSITY (GW/cm²) | EXAMPLES SUCCEEDED |
|---|---|---|---|---|
| 2500 | 0.424 | 1.157387 | 2.653 | — |
| 1000 | 0.552 | 2.484903 | 4.730 | — |
| 500 | 0.560 | 4.698272 | 8.326 | 2 |
| 312.5 | 0.624 | 6.625539 | 11.177 | — |
| 200 | 0.552 | 9.865077 | 17.918 | 1 |
| 166.7 | 0.568 | 11.01054 | 19.644 | 1 |
| 100 | 0.576 | 12.99831 | 23.698 | 1 |

(b)

| REPETITION FREQUENCY (kHz) | PULSE WIDTH (ns) | FLUENCE (J/cm²) | MAX IRRADIATION INTENSITY (GW/cm²) | EXAMPLES SUCCEEDED |
|---|---|---|---|---|
| 500 | 17.7 | 8.585242 | 0.669 | — |
| 200 | 13.3 | 21.88287 | 2.167 | — |
| 100 | 6.0 | 47.34857 | 6.608 | — |
| 50 | 5.3 | 76.75919 | 14.222 | — |

(c)

| REPETITION FREQUENCY (kHz) | PULSE WIDTH (ns) | FLUENCE (J/cm²) | MAX IRRADIATION INTENSITY (GW/cm²) | EXAMPLES SUCCEEDED |
|---|---|---|---|---|
| 400 | 2.7 | 8.680917 | 3.747 | 2 |
| 200 | 2.2 | 18.28031 | 9.192 | — |
| 150 | 1.8 | 23.36472 | 13.010 | — |
| 100 | 1.4 | 31.33719 | 18.242 | — |

…

LASER PROCESSING METHOD AND LASER PROCESSING DEVICE

TECHNICAL FIELD

The present invention relates to a laser processing method and laser processing apparatus which remove a predetermined part of a resin insulating layer laminated on a conductor layer by irradiating it with pulsed laser light.

BACKGROUND ART

Printed boards constituted by laminated conductor and insulating layers have now become one of indispensable industrial materials in the fields of electronics, communications, automobiles, and the like. Low cost, high reliability, and high throughput are also required for processing the printed boards as a matter of course. With the advent of demands for reducing environmental burdens, there has recently been a vigorous trend to substitute the conventional chemical processing with laser processing.

PRIOR ART DOCUMENT

Patent Document

Patent Document 1: Japanese Patent Application Laid-Open No. 2002-118344
Patent Document 2: U.S. Pat. No. 5,593,606
Patent Document 3: Japanese Patent No. 3824522

DISCLOSURE OF THE INVENTION

Problems that the Invention is to Solve

The present inventors have examined the conventional laser processing technique, and as a result, have discovered the following problems.

Namely, in the laser processing of printed boards, as pointed out in paragraphs [0012] and [0013] of Patent Document 1, an insulating layer in contact with a conductor layer is very thin (having a thickness of 0.2 to 3 µm), so that the heat caused by laser light irradiating the insulating layer may diffuse into the conductor layer having a high thermal conductivity, thereby making it hard to perform laser processing for removing the insulating layer. Though polyimide-based resins are used most frequently for such an insulating layer in particularly important flexible printed boards nowadays, the transmittance of the polyimide-based resins is 80% or higher in a wavelength region of 0.8 µm or longer (i.e., in the near-infrared region) as shown in FIG. 1, thus making it harder to process the polyimide-based resins by using the heat of laser light irradiation.

In order to overcome such a difficulty, Patent Documents 1 and 2 propose to use UV laser light having a wavelength of 400 nm or shorter, for which the insulating layer exhibits a low transmittance (i.e., high absorptance). In this wavelength region, however, copper which is most frequently used as the conductor layer also exhibits high absorptance as shown in FIG. 2; therefore, though no problem occurs at the time of processing a hole which penetrates through both the insulating and conductor layers, for example, not only the insulating layer but also the conductor layer may adversely be removed in the case of processing a blind via hole which necessitates a desmearing step as pointed out in Patent Document 1.

In order to avoid such a problem, Patent Document 1 proposes a laser processing method of roughly removing the insulating layer with $CO_2$ laser light and then carrying out a finishing step with UV laser light in which the energy density of laser light irradiation (hereinafter referred to as fluence) ($J/cm^2$) is set lower than the decomposition threshold of the conductor layer but higher than that of the insulating layer, and the like. Taking the trouble to use such a plurality of wavelengths of laser light, however, not only increases the cost for manufacturing equipment, but also lowers the reliability and throughput.

Most of all, as stated in Patent Document 2, the use of the UV laser light itself necessitates a nonlinear optical crystal for generating harmonics, thereby causing the risk of optically damaging the nonlinear optical crystal per se to lower the reliability, reduce and fluctuate the output power, vary emitted beam profiles, increase the cost, and so forth, thus failing to match the above-mentioned demands for the printed board processing.

The UV laser light having a wavelength of 400 nm or shorter has a conversion efficiency of 40% at most in the process of wavelength conversion for generating the third-order harmonics. This increases the power consumption, thereby often requiring water-cooling equipment as well, which is also undesirable from the viewpoint of saving the power consumption.

The present invention has been developed to eliminate the problems described above. It is an object of the present invention to provide a laser processing method and laser processing apparatus which use no wavelength conversion technique by nonlinear optical crystals in laser processing of an insulating layer which is one of constituents of printed boards and the like, selective removal of the insulating layer in particular, while employing only one wavelength throughout the entire removal processing throughout the entire removal processing.

Means for Solving the Problems

The laser processing method according to the present invention is a laser processing method of irradiating an object including a multilayer structure, such as a printed board, constituted by a conductor layer and an insulating layer comprised of a resin (the insulating layer also including an adhesive for making it come into direct contact with the conductor layer) with pulsed laser light, so as to remove a part of the insulating layer located in a predetermined region on the conductor layer. One embodiment of the laser processing method carries out the object placing step, the wavelength selecting step for the pulsed laser light to be irradiated, the energy setting step for the pulsed laser light to be irradiated, and the emitting step for the pulsed light. These steps are executed by the laser processing apparatus (first structure) according to the present invention, while a MOPA (Master Oscillator Power Amplifier) structure is constructed by a seed light source, an amplification optical fiber, wavelength selecting means, and the like in the laser processing apparatus having the first structure.

Particularly, in the object placing step, the object is placed such that the pulsed laser light reaches the conductor layer after passing through the insulating layer. In the wavelength selecting step, a wavelength, exhibiting an absorptance of 10% with respect to the conductor layer, is selected as the wavelength of the pulsed laser light. In the energy setting step, the fluence per one pulse of the pulsed laser light is set to a fracture damage threshold of the insulating layer or higher. Here, the "fracture damage threshold" refers to the decomposition threshold of the insulating layer as also disclosed in Patent Document 1 and is the lowest fluence at which the insulating layer begins to be removed by fractures, damages, and vaporization. In the emitting step, the predetermined region of the placed object is irradiated with the pulsed laser light having the wavelength selected as described above and the fluence per one pulse set as mentioned above.

Another embodiment of the laser processing method according to the present invention may carry out the object placing step, the wavelength selecting step for the pulsed laser light to be irradiated, the energy setting step for the pulsed laser light to be irradiated, the repetition frequency setting step for the pulsed laser light to be irradiated, and the emitting step for the pulsed laser light. Each of these steps can also be executed by the laser processing apparatus having the above-mentioned first structure.

Particularly, in the object placing step, the object is placed such that the pulsed laser light reaches the conductor layer after passing through the insulating layer. In the wavelength selecting step, a wavelength, exhibiting an absorptance of 10% with respect to the conductor layer, is selected as the wavelength of the pulsed laser light. In the energy setting step, the fluence per one pulse of the pulsed laser light is set in relation to a carbon concentration detected on the conductor layer surface after destroying the insulating layer. The fluence per one pulse may be set such as to fall within a tolerable range of 10 to 13 $J/cm^2$, for example. In the repetition frequency setting step, the repetition frequency of the pulsed laser light is set such that the pulsed laser light has a full width at half maximum of less than 5 ns. In the emitting step, the predetermined region of the placed object is irradiated with the pulsed laser light which has the wavelength selected, and has the fluence per one pulse and repetition frequency set as mentioned above.

In each of the embodiments of the laser processing method according to the present invention, the wavelength of the pulsed laser light preferably have a transmittance of 70% or greater with respect to the insulating layer.

As a second structure, the laser processing apparatus according to the present invention may use the laser processing apparatus having the above-mentioned first structure as a laser light source and comprise an irradiation optical system for sweeping the pulsed laser light within a processing region of the insulating layer surface where the pulsed laser light reaches. In this case, the pulsed laser light irradiates the surface of the insulating layer surface while being swept such that, with respect to a beam spot of the pulsed laser light emitted, a beam spot of the pulsed laser light to be emitted subsequently has an overlap ratio (the width of the overlapping area on a line connecting two spot centers/spot diameter×100) of 40% to 90% on the insulating layer surface.

Preferably, in each of the embodiments of the laser processing method according to the present invention, the wavelength of the pulsed laser light is a wavelength that can be directly emitted from a laser light source using a photoactive medium containing a rare-earth element. It is preferable that the photoactive medium is a Yb-doped optical fiber in this case.

In each of the embodiments of the laser processing method according to the present invention, the full width at half maximum of the pulsed laser light is preferably set to such an extent that no processing residue of the insulating layer remains as a film or island on the conductor layer surface. The full width at half maximum of the pulsed laser light is preferably longer than 10 ps but shorter than 5 ns. An irradiation intensity of the pulsed laser light at a pulse peak is preferably set to such an extent that no processing residue of the insulating layer remains as a film or island on the conductor layer surface. This is because the carbon concentration detected on the conductor layer surface after destroying the insulating layer can further be lowered thereby.

Preferably, in the laser processing apparatus having the above-mentioned second structure, assuming that a beam sweep traveling from a sweep start point to a sweep end point while drawing a given pattern within the processing region is one unit, the laser light source changes at least one of the pulse width and repetition frequency in conditions for generating the pulsed laser light at least once during a period of the one unit of beam sweep. It is preferable that the laser light source sets the fluence per one pulse of the pulsed laser light in an initial stage of the beam sweep including the sweep start point in the one unit of the beam sweep greater than that in a period subsequent to the initial stage of the beam sweep. This is because such a structure can greatly improve the processing efficiency. The beam sweep pattern can be set arbitrarily in conformity to the form of the processing region and may encompass various sweep patterns such as those having a spiral form constituted by curved components alone, those constituted by linear components alone, and those constituted by combinations of curved and linear components, for example.

In the laser processing apparatus having the above-mentioned second structure, the laser light source preferably set the irradiation intensity at the pulse peak of the pulsed laser light in an end stage of the beam sweep including the sweep end point in the one unit of the beam sweep greater than that at the pulse peak of the pulsed laser light in a period before the end stage of the beam sweep. The irradiation optical system preferably irradiate the insulating layer surface with the pulsed laser light swept such that, with respect to a beam spot of the pulsed laser light emitted, a beam spot of the pulsed laser light to be emitted subsequently has an overlap ratio of 40% to 90% on the insulating layer surface. This can effectively reduce the processing residue of the insulating layer. The conductor layer located under the insulating layer can also be kept from being damaged.

Effects of the Invention

In accordance with the laser processing method and laser processing apparatus according to the present invention, no wavelength conversion technique by nonlinear optical crystals is used when selectively removing insulating layers of printed boards and the like, and only one wavelength can be employed in all the steps.

BRIEF DESCRIPTION OF THE DRAWINGS

FIG. 20 is a set of tables listing relationships among the repetition frequency, pulse width, and fluence in modes 1, 2, and 2A.

BEST MODES FOR CARRYING OUT THE INVENTION

Figure 1:
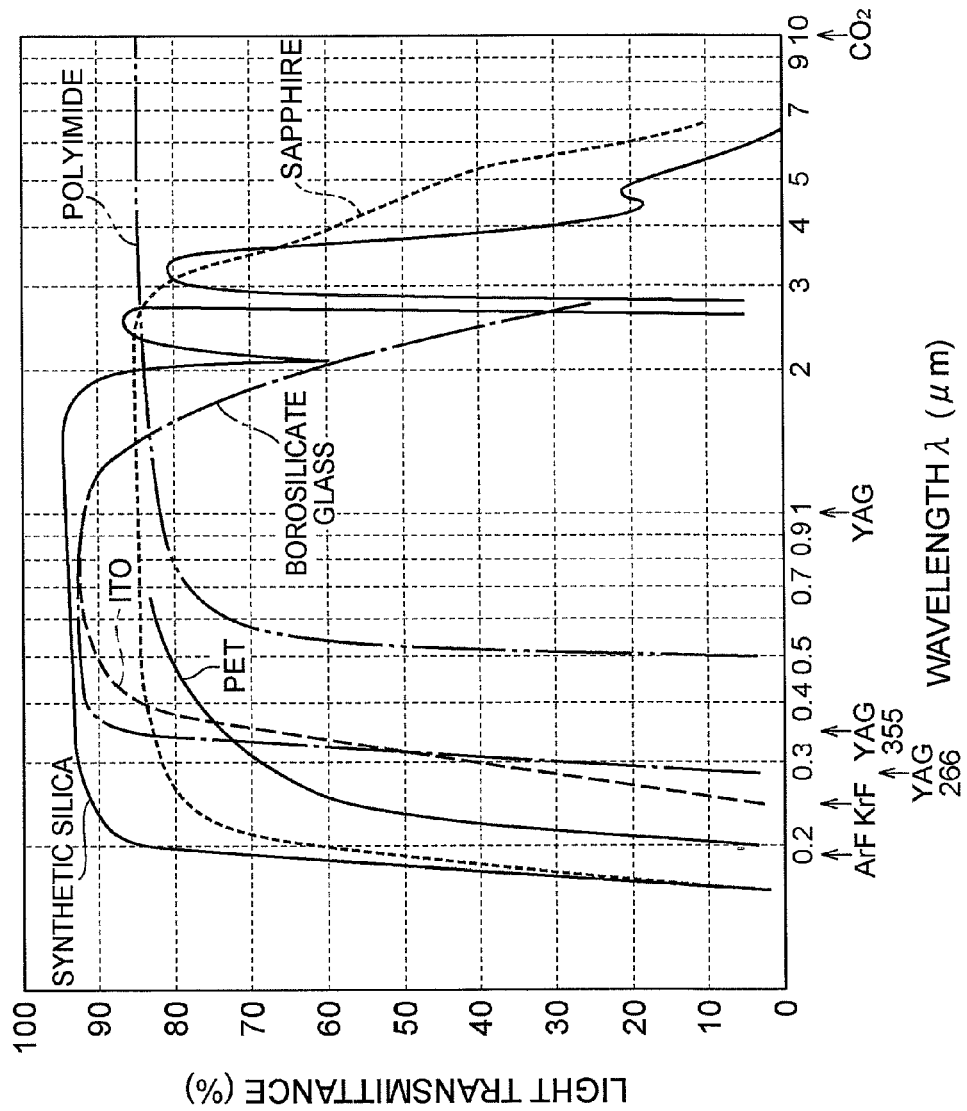
FIG. 1 is a view showing respective transmittance spectra of various insulators.
Figure 2:
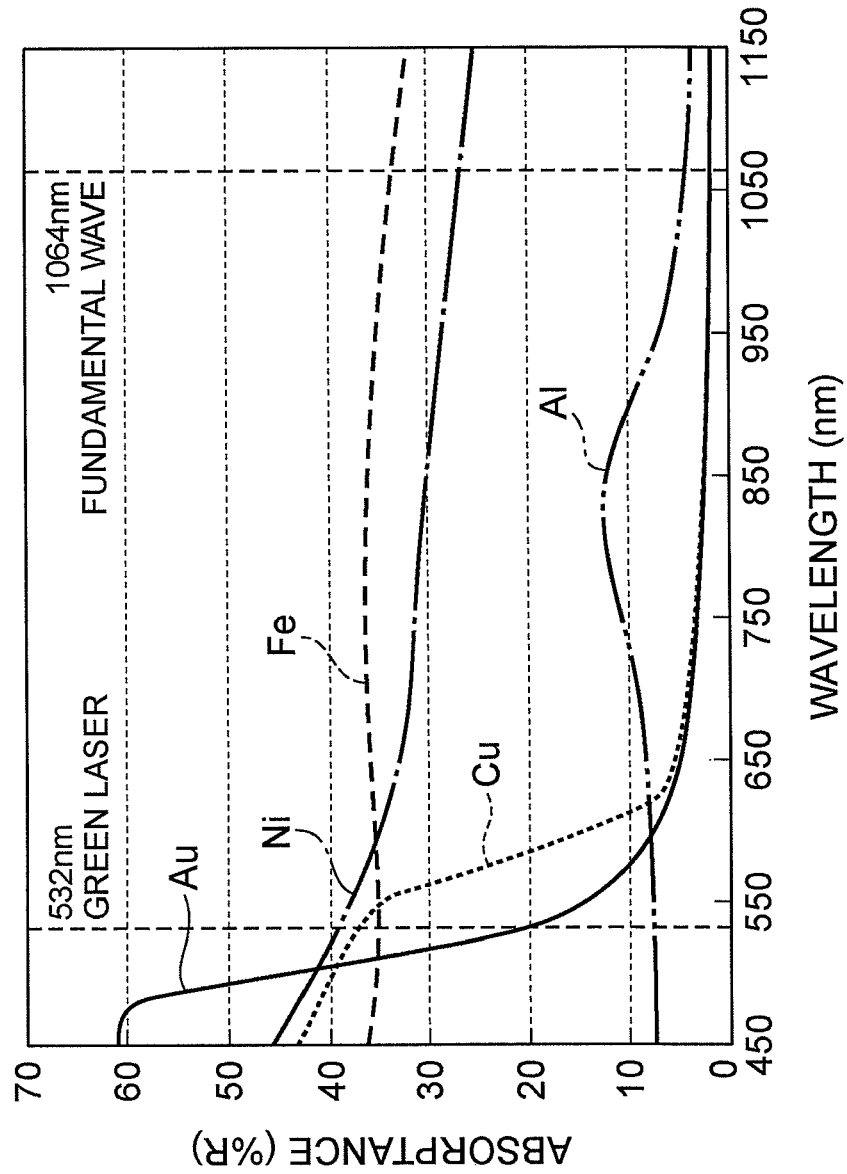
FIG. 2 is a view showing absorptance spectra of various metals.

In the following, embodiments of the laser processing method and laser apparatus according to the present invention will be explained in detail with reference to FIGS. 3 to 20. In the description of the drawings, identical or corresponding components are designated by the same reference numerals, and overlapping description is omitted.

Figure 3:
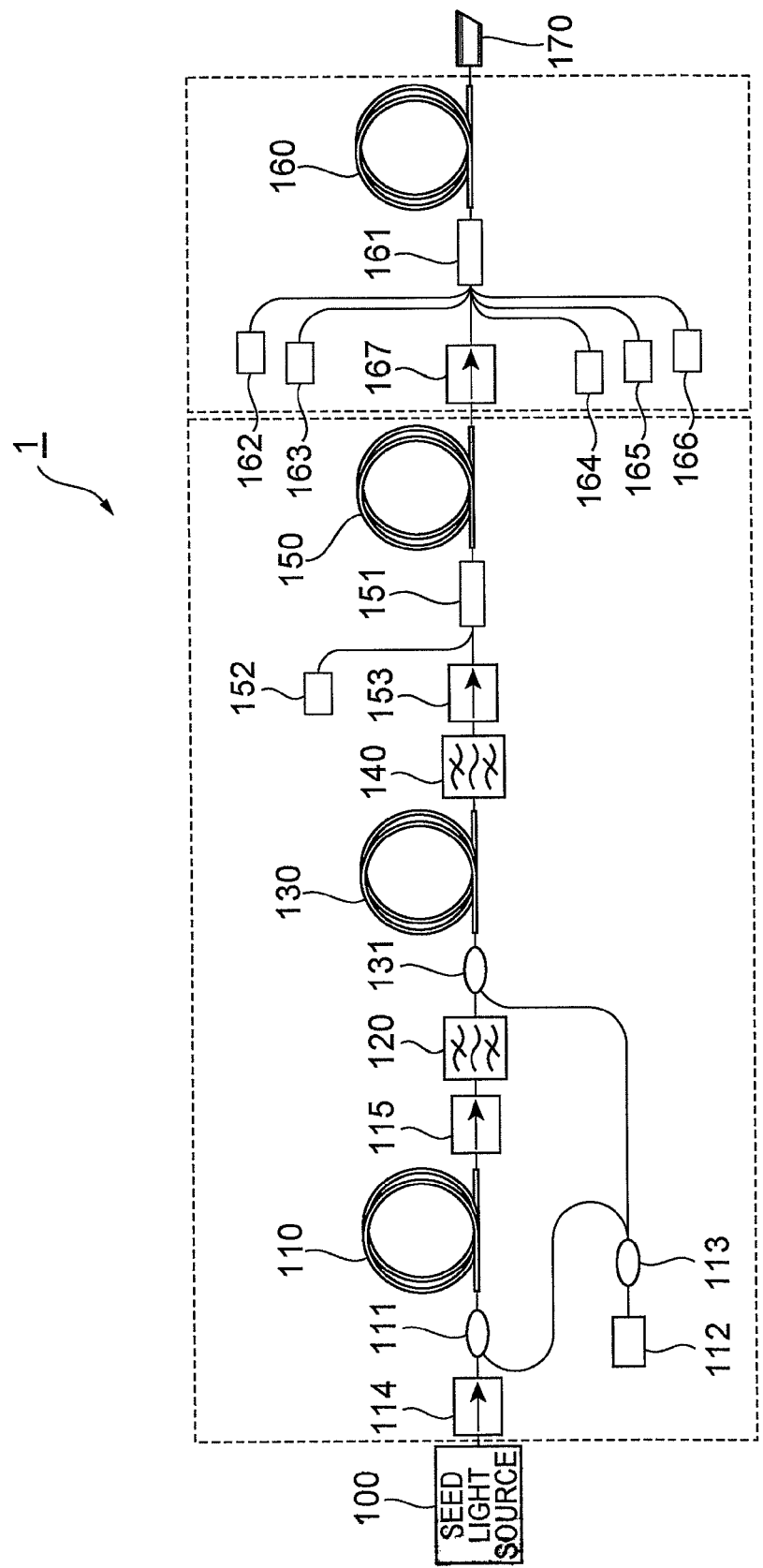
FIG. 3 is a view showing the structure of a first embodiment (first structure) of a laser processing apparatus preferably used in the laser processing method according to the present invention.

FIG. 3 is a view showing the structure of the first embodiment (first structure) of a laser processing apparatus favorably used in the laser processing method according to an embodiment. In FIG. 3, a laser processing apparatus 1 according to the first embodiment comprises a seed light source 100, a YbDF 110, a bandpass filter 120, a YbDF 130, a bandpass filter 140, a YbDF 150, a YbDF 160, and so forth, while these constituents construct a MOPA structure. This laser processing apparatus 1 outputs pulsed laser light having a wavelength near 1060 nm suitable for laser processing, specifically 1040 nm to 1150 nm.

The seed light source 100 includes a directly modulatable semiconductor, which outputs the pulsed laser light. The semiconductor laser is preferably a Fabry-Perot laser from the viewpoints of attaining higher power and avoiding nonlinear effects such as stimulated Brillouin scattering (SBS). The semiconductor laser outputs pulsed laser light having a wavelength near 1060 nm where YbDFs 20, 40, 50, each serving as an amplification optical fiber, have a gain.

The YbDFs 110, 130, 150, 160, each obtained by doping a core of an optical fiber comprised of glass with elemental Yb as an active material, are optical elements which amplify the pulsed laser light having a wavelength near 1060 nm issued from the seed light source 100. The YbDFs 110, 130, 150, 160 are advantageous in terms of power conversion efficiency, since their pumping light and light to be amplified have wavelengths close to each other. The YbDFs 110, 130, 150, 160 are also advantageous in that they attain a high gain near the wavelength of 1060 nm. These YbDFs 110, 130, 150, 160 construct a four-stage optical fiber amplifier.

The YbDF 110 of the first stage is forwardly supplied with pumping light passing through optical couplers 113, 111 in sequence after being outputted from a pumping light source 112. The YbDF 110 amplifies the pulsed laser light having passed through an optical isolator 114 and the optical coupler 111 in sequence after being outputted from the seed light source 100. The pulsed laser light amplified by the YbDF 110 is outputted through an optical isolator 115.

The bandpass filter 120 inputs the pulsed laser light having passed through the optical isolator 115 after being amplified by the YbDF 110 of the first stage and attenuates a specific wavelength band component in the wavelength band of thus inputted pulsed laser light.

The YbDF 130 of the second stage is forwardly supplied with pumping light passing through optical couplers 113, 131 in sequence after being outputted from the pumping light source 112. The YbDF 130 amplifies the pulsed laser light having passed through the optical isolator 131 after being outputted from the bandpass filter 120.

The bandpass filter 140 inputs the pulsed laser light amplified in the YbDF 130 of the second stage and attenuates a specific wavelength band component in the wavelength band of thus inputted pulsed laser light.

The YbDF 150 of the third stage is forwardly supplied with pumping light having passed through an optical coupler 151 after being outputted from a pumping light source 152. The YbDF 150 amplifies the pulsed laser light passing through an optical isolator 153 after being outputted from the bandpass filter 140.

The YbDF 160 of the fourth stage is forwardly supplied with pumping light having passed through a combiner 161 after being outputted from each of pumping light sources 162 to 166. The YbDF 160 amplifies the pulsed laser light having passed through an optical isolator 167 and the combiner 161 in sequence after being amplified in the YbDF 150 in the third stage. The pulsed laser light amplified by the YbDF 160 is outputted to the outside of the laser processing apparatus (laser light source) through an end cap 170.

The following is a more preferred structural example. The YbDF 110 of the first stage is a single-cladding, Al-codoped, silica-based YbDF having an Al concentration of 5 wt %, a core diameter of 10 μm, a cladding diameter of 125 an unsaturated absorption of 70 dB/m to 915-nm-band pumping light, an unsaturated absorption peak of 240 dB/m to 975-nm-band pumping light, and a fiber length of 7 m. The YbDF 130 of the second stage is a single-cladding, Al-codoped, silica-based YbDF having an Al concentration of 5 wt %, a core diameter of 10 μm, a cladding diameter of 125 μm, an unsaturated absorption of 70 dB/m to 915-nm-band pumping light, an unsaturated absorption peak of 240 dB/m to 975-nm-band pumping light, and a fiber length of 7 m.

The YbDF 150 of the third stage is a double-cladding, phosphate-glass-based YbDF having a P concentration of 26.4 wt %, an Al concentration of 0.8 wt %, a core diameter of 10 μm, a first cladding with an octagonal cross-sectional form with an outer diameter of 125 μm, an unsaturated absorption of 1.8 dB/m to 915-nm-band pumping light, and a fiber length of 3 m. The YbDF 160 of the fourth stage is a double-cladding, Al-codoped, silica-based YbDF having an Al concentration of 5 wt %, a core diameter of 10 μm, a cladding diameter of 125 μm, an unsaturated absorption of 80 dB/m to 915-nm-band pumping light, and a fiber length of 3.5 m.

Each of the pumping light beams supplied to the YbDFs 110, 130, 150, 160 has a wavelength in the band of 0.975 μm. The pumping light supplied to the YbDF 110 is single-mode light having a power of 200 mW. The pumping light supplied to the YbDF 130 is single-mode light having a power of 200 mW. The pumping light supplied to the YbDF 150 is multi-mode light having a power of 2 W. The pumping light supplied to the YbDF 160 is multimode light having a power of 14 W.

The laser processing apparatus 1 according to the first embodiment employs a Fabry-Perot semiconductor laser as the seed light source 100. For yielding shorter pulses, the bandpass filter 120 disposed downstream of the seed light source 100 has a center wavelength adjusted such as to attain the state of curve C2 or C3 as shown in the areas (a) and (b) of FIG. 4, whereby the full width at half maximum of the pulsed laser light can be compressed from about 5 nm to 0.5 ns.

Figure 4:
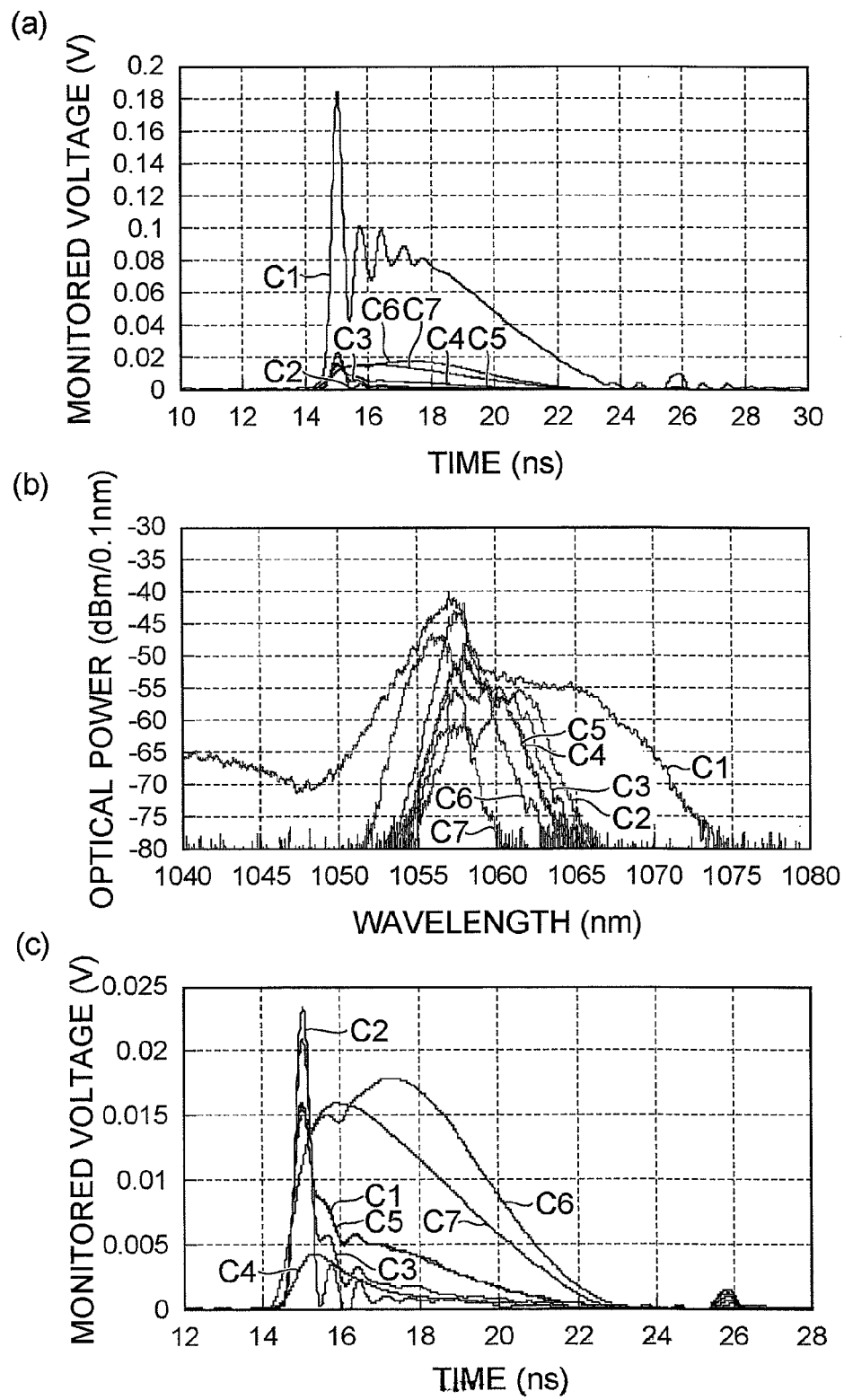
FIG. 4 is a set of views showing pulse waveforms and spectra in the case where output pulses of a seed light source are deformed by adjusting the center wavelength of a band-pass filter disposed downstream of the seed light source.

The area (a) of FIG. 4 represents pulse waveforms in the case where output pulses of the seed light source 100 are deformed by adjusting the center wavelength of the bandpass filter 120 disposed downstream of the seed light source 100. The area (b) of FIG. 4 represents spectra in this case. The area (c) of FIG. 4 is a chart magnifying a part of the area (a) of FIG. 4. Curve C1 shown in each area refers to the case with no bandpass filter. Curves C2 to C7 refer to respective cases where the center wavelength of the bandpass filter 120 is gradually shifted from the longer wavelength side to the shorter wavelength side.

When the center wavelength of the bandpass filter 120 is greatly detuned from the center wavelength of the spectrum of the seed light source 100 as in the curves C2 and C3, the ASE generated in its downstream YbDFs increases. For suppressing such ASE components, it is desirable that a plurality of bandpass filters be inserted within an optical amplifier connected to the downstream of the seed light source as shown in FIG. 3.

Figure 5:
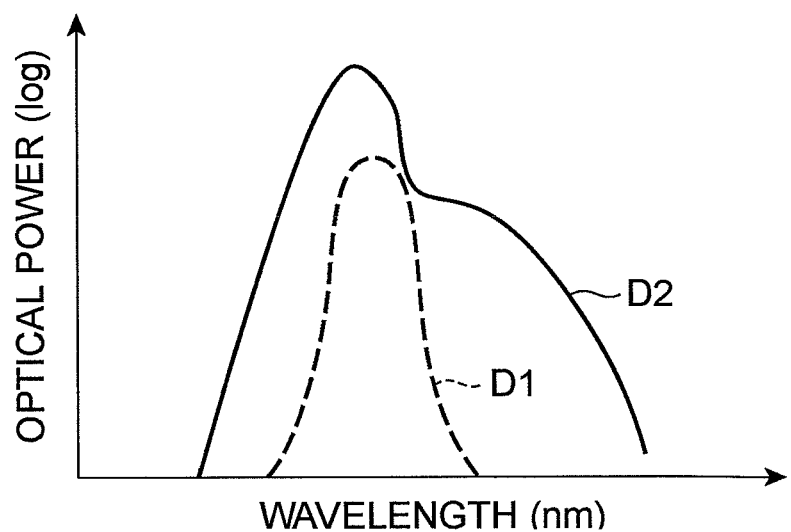
FIG. 5 is a set of views schematically showing how the bandpass filter in the laser processing apparatus of FIG. 3 according to the first embodiment removes ASE.
Figure 5:
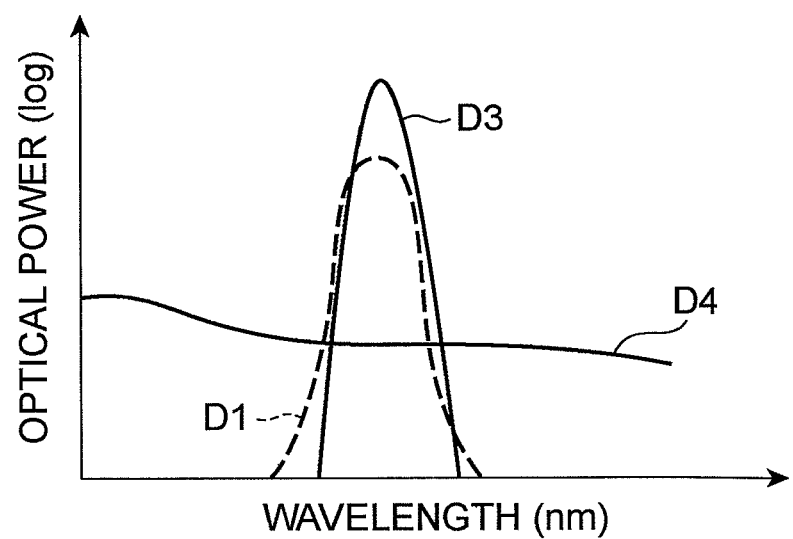
Figure 6:
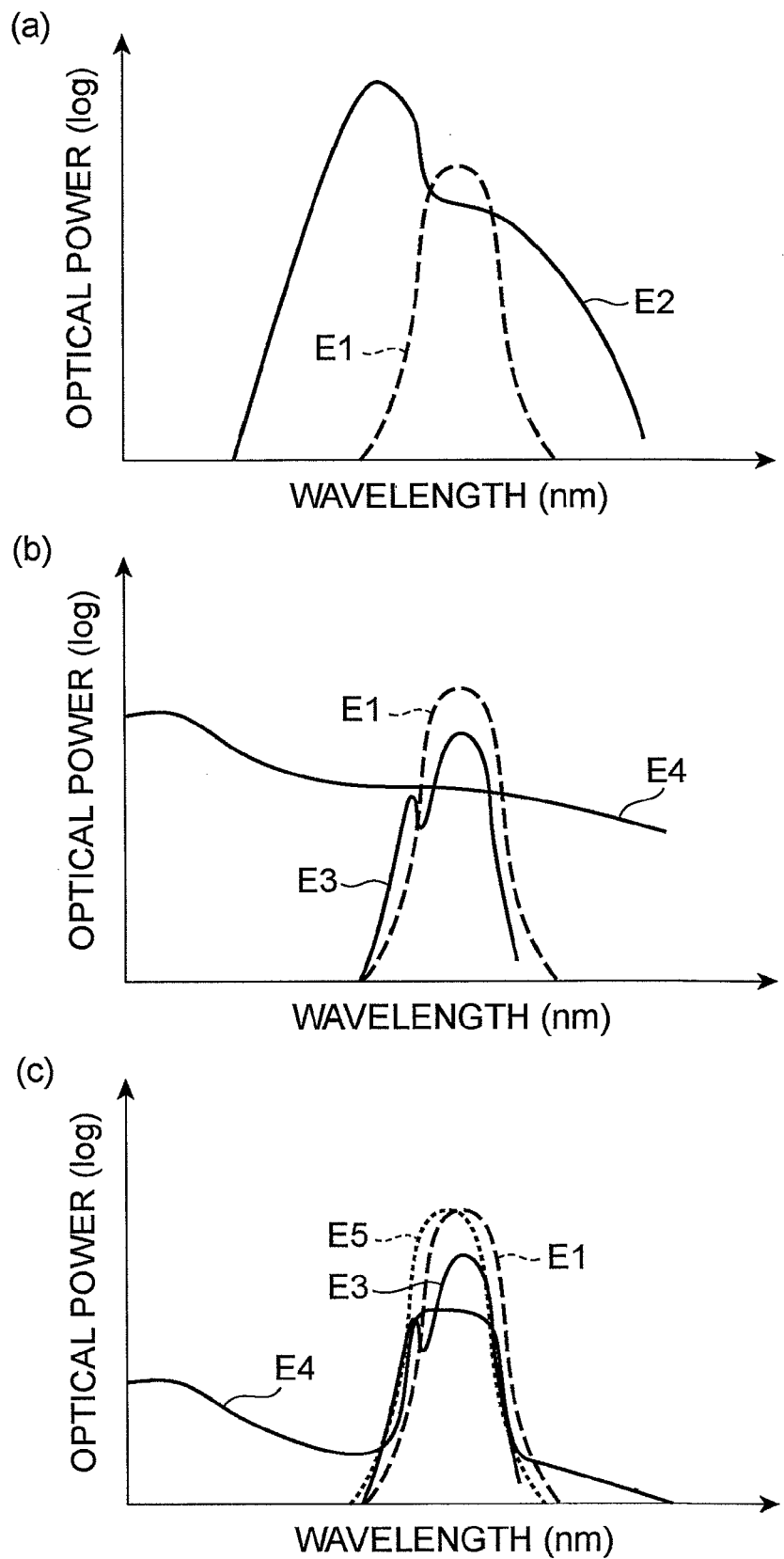
FIG. 6 is a set of views schematically showing how the bandpass filter in the laser processing apparatus of FIG. 3 according to the first embodiment removes ASE.

Each of the respective transmission spectra of the bandpass filters 120, 140 has a full width at half maximum of 3 nm. FIGS. 5 and 6 are views schematically showing how the bandpass filters 120, 140 remove the ASE in the laser processing apparatus 1 (FIG. 3).

When the center wavelength in the transmission spectrum of the bandpass filter 120 (D1 in the areas (a) and (b) of FIG. 5) substantially coincides with the peak wavelength in the spectrum of the output light of the seed light source 10 (D2 in the area (b) of FIG. 5) as shown in FIG. 5, the power of the light issuing from the bandpass filter 120 (D3 in the area (b) of FIG. 5) can be kept high. As a result, the S/N ratio compared with the ASE component included in the light outputted from the YbDF 130 disposed downstream of the bandpass filter 120 (D4 in the area (b) of FIG. 5) can be held high.

When the center wavelength in the transmission spectrum of the bandpass filter 120 (E1 in the areas (a) to (c) of FIG. 6) greatly deviates from the peak wavelength in the spectrum of the output light of the seed light source 10 (E2 in the area (a) of FIG. 6) as shown in FIG. 6, by contrast, the power of the light issuing from the bandpass filter 120 (E3 in the area (b) of FIG. 6) greatly decays from that at the time of input. As a result, the S/N ratio compared with the ASE component included in the light outputted from the YbDF 130 disposed downstream of the bandpass filter 120 (E4 in the areas (b) and (c) of FIG. 6) greatly deteriorates. For avoiding this, the bandpass filter 140 is further inserted downstream of the YbDF 130, whereby the S/N ratio of the light issuing from the bandpass filter 120 (E5 in the area (c) of FIG. 6) can be improved. Here, it is desirable that the center wavelength of the band pass filter 140 be set closer to the peak wavelength of the output spectrum of the seed light source 10 than is the center wavelength of the bandpass filter 120.

As the YbDF 150 of the third stage, a phosophate-glass-based YbDF having an ASE band narrower than that of an Al-codoped, silica-based YbDF is employed.

Figure 7:
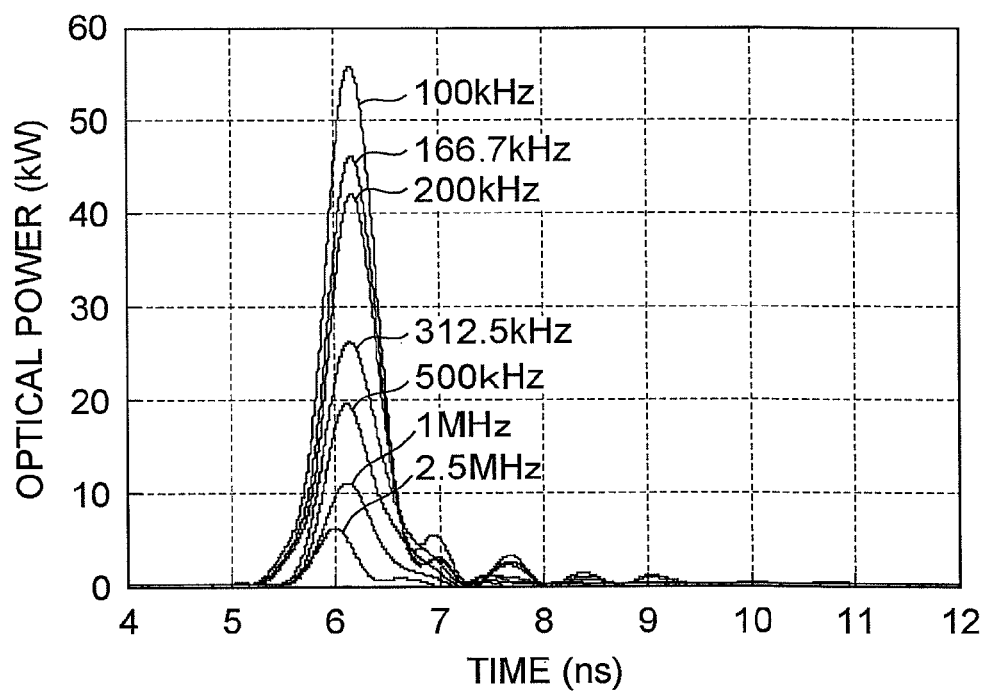
FIG. 7 is a view showing pulse waveforms of output pulse laser light of the laser processing apparatus (FIG. 3) in mode 1.
Figure 8:
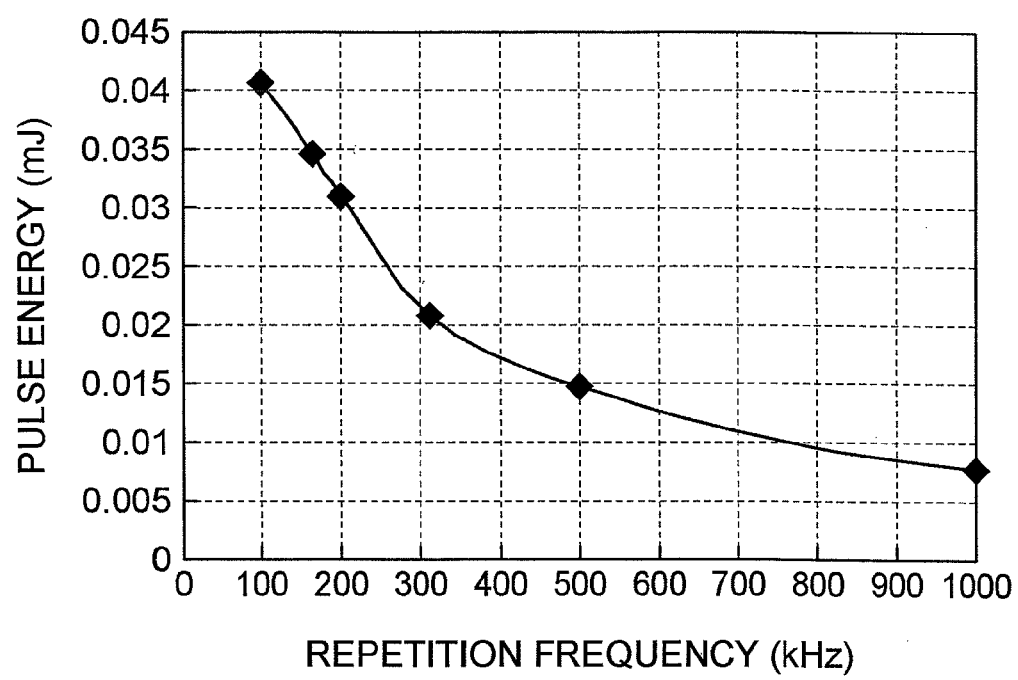
FIG. 8 is a view showing the relationship between the repetition frequency and pulse energy of output pulse laser light of the laser processing apparatus (FIG. 3) in mode 1.

Thus constructed laser processing apparatus 1 has achieved an output having a pulse peak reaching 56 kW at the maximum as shown in FIG. 7. FIG. 7 shows respective pulse waveforms at repetition frequencies of 100 kHz, 166.7 kHz, 200 kHz, 312.5 kHz, 500 kHz, 1 MHz, and 2.5 MHz. For measuring the pulse waveforms, a spatial attenuator having an attenuation of about 65 dB was inserted downstream the end cap 170 at an output end of the laser processing apparatus 1, the output light from the end cap 170 was received by a photoelectric conversion module (SIR5-FC) manufactured by Thorlabs, and electric output waveforms from the photoelectric conversion module were observed with an oscilloscope (DL9240) manufactured by Yokogawa Electric Corporation. The pulse width was within the range of 0.5±0.1 nm under any condition at the repetition frequencies of 2.5 MHz to 100 kHz. FIG. 8 is a view showing the relationship between the repetition frequency and pulse energy of output pulse laser light of the laser processing apparatus 1. As shown in FIG. 8, the pulse energy of the output pulsed laser light was 0.041 mJ at the maximum. This operation state will hereinafter be referred to as mode 1 for convenience.

Figure 9:
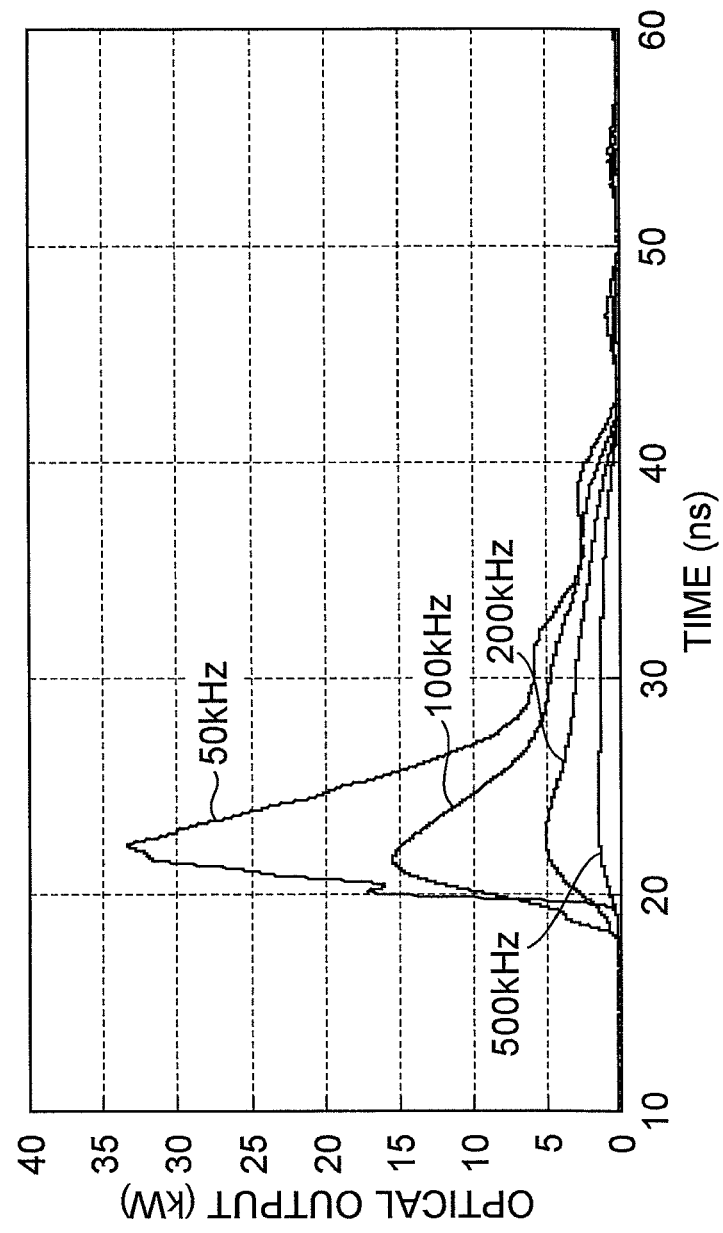
FIG. 9 is a view showing pulse waveforms of output pulse laser light of the laser processing apparatus (FIG. 3) in mode 2.
Figure 10:
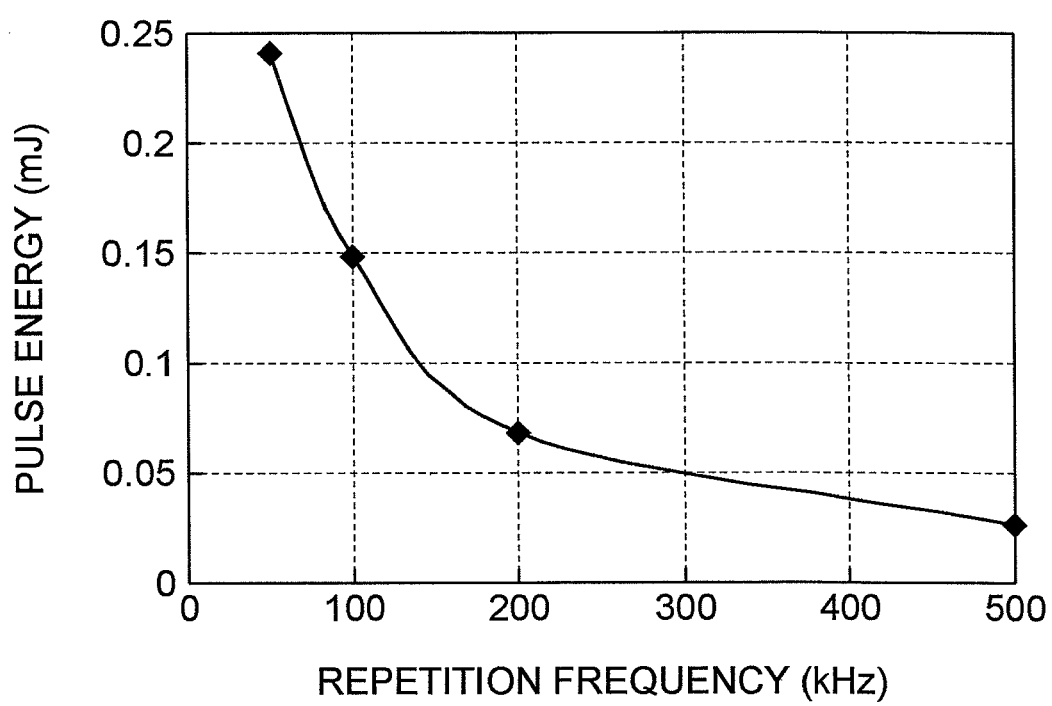
FIG. 10 is a view showing the relationship between the repetition frequency and pulse energy of output pulse laser light of the laser processing apparatus (FIG. 3) in mode 2.

For comparison, laser processing was tried with output pulsed laser light having a full width at half maximum of 5 ns or greater without adjusting the bandpass filter 120 in order to attain shorter pulses as mentioned above in a structure excluding the bandpass filter 140 from the structure shown in FIG. 3. This operation state will hereinafter be referred to as mode 2 for convenience. FIG. 9 is a view showing pulse waveforms of output pulse laser light of the laser processing apparatus 1 in mode 2. FIG. 10 is a view showing the relationship between the repetition frequency and pulse energy of output pulse laser light of the laser processing apparatus 1 in mode 2. Since the electric pulse modulation width is set to 20 ns, the full width at half maximum of the pulse is 18 ns when the repetition frequency is 500 kHz. However, transient responses of the optical fiber amplifier section make the full width at half maximum of the pulse shorter as the repetition frequency is lower. For example, the full width at half maximum of the pulse becomes 5.3 nm when the repetition frequency is 50 kHz. Its pulse energy becomes 0.24 mJ at the maximum as shown in FIG. 10, thus reaching about six times that in the case of mode 1.

Figure 11:
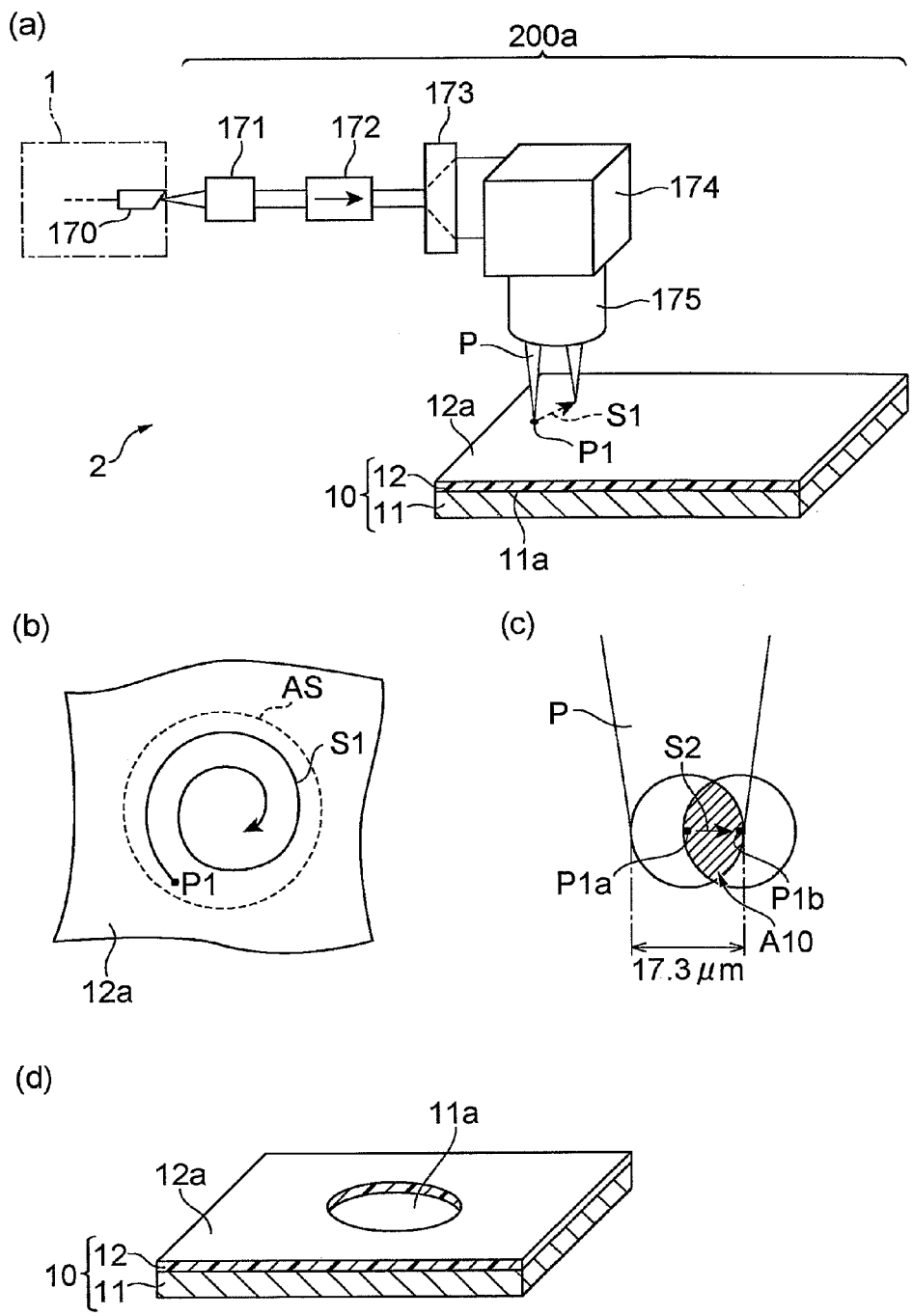
FIG. 11 is a set of views showing the structure of a second embodiment (second structure) of the laser processing apparatus favorably used in the laser processing method according to the present invention.

An experiment in which an object to be processed was irradiated with pulsed laser light issuing from the laser processing apparatus 1 will now be explained. In particular, FIG. 11 shows the structure of a laser processing apparatus 2 according to the second embodiment achieving such an experiment. As shown in the area (a) of FIG. 11, the laser processing apparatus 2 according to the second embodiment employs the laser processing apparatus 1 according to the first embodiment as a laser light source and further comprises an illumination optical system 200a. The irradiation optical system extending from the end cap 170 of the laser processing apparatus 1 (laser light source) to the object is constituted by a collimator 171 having an emission beam diameter of 1.6 mm, a polarization-independent isolator 172, a beam expander 173 having a magnification of 8×, a galvano scanner 174, and a telecentric fθ lens 175 in sequence. These optical elements yield a transmittance of 75% with respect to the pulsed laser light outputted from the end cap 170. The fθ lens has a focal length of 164 mm. The beam spot diameter d on an object 10 is given by the equation of "d=(4/π)·(focal length× wavelength)/(beam diameter before lens)", which yields 17.3 μm. As a result, the spot area of laser light in the object is $2.35 \times 10^{-6}$ cm$^2$.

Through the fθ lens 175, the galvano scanner 174 irradiates the surface of the object 10 with pulsed laser light P swept in a direction indicated by arrow S1 from a sweep start point P1. The object 10 has a multilayer structure constituted, at least, by a conductor layer 11 and an insulating layer 12 disposed on a surface 11a of the conductor layer 11 so as to come into direct contact therewith. The center of the pulsed laser light P irradiating a surface 12a of the insulating layer 12 is swept spirally along the direction indicated by arrow S1 from the start point P1 within the processing region AS, as shown in the area (b) of FIG. 11. As shown in the area (c) of FIG. 11, adjacent centers P1a, P1b of pulsed laser light P (the center of pulsed laser light moving in a direction indicated by arrow S2) satisfy a predetermined overlap ratio (preferably 40% to 90%) such that their beam spots overlap each other in an area A10. Though the area (b) of FIG. 11 shows a spiral sweep pattern as an example of beam sweep patterns, it is not restrictive. In addition to spiral sweep patterns, any beam sweep patterns such as those constituted by linear components alone, and those constituted by combinations of curved and linear components, for example, can be set.

Sweeping the pulsed laser light P within the processing region AS as in the foregoing can expose the surface 11a of the conductor layer 11 at a removed part of the insulating layer 12 (corresponding to the processing region AS) as shown in the area (d) of FIG. 11.

For improving the performance for removing the insulating layer 12, it is further effective to blow a supporting gas such as oxygen as an assist gas onto the pulsed laser light irradiation region (processing region AS). Since a high efficiency is required for processing holes in printed boards, however, the galvano scanner 174 and telecentric fθ lens 175 are mostly required to sweep a beam at a high speed as mentioned above (see paragraph [0035] in the present specification). In this case, the beam spot of the pulsed laser light moves at a high speed, thereby making it impossible to blow the supporting gas onto the beam spot alone. As countermeasures against it, a laser processing apparatus 3 according to the third embodiment is equipped with a structure in which a wind tunnel 176 is placed directly under the fθ lens 175 (between the fθ lens 175 and the surface 12a of the insulating layer 12), while the supporting gas (O$_2$) is injected into the wind tunnel 176. Particularly, as shown in FIG. 12, the laser processing apparatus 3 according to the third embodiment has substantially the same structure as that of the laser processing apparatus 2 according to the second embodiment but structurally differs therefrom in that the wind tunnel 176 is disposed between the fθ lens 175 and the surface 12a of the insulating layer 12.

Figure 13:
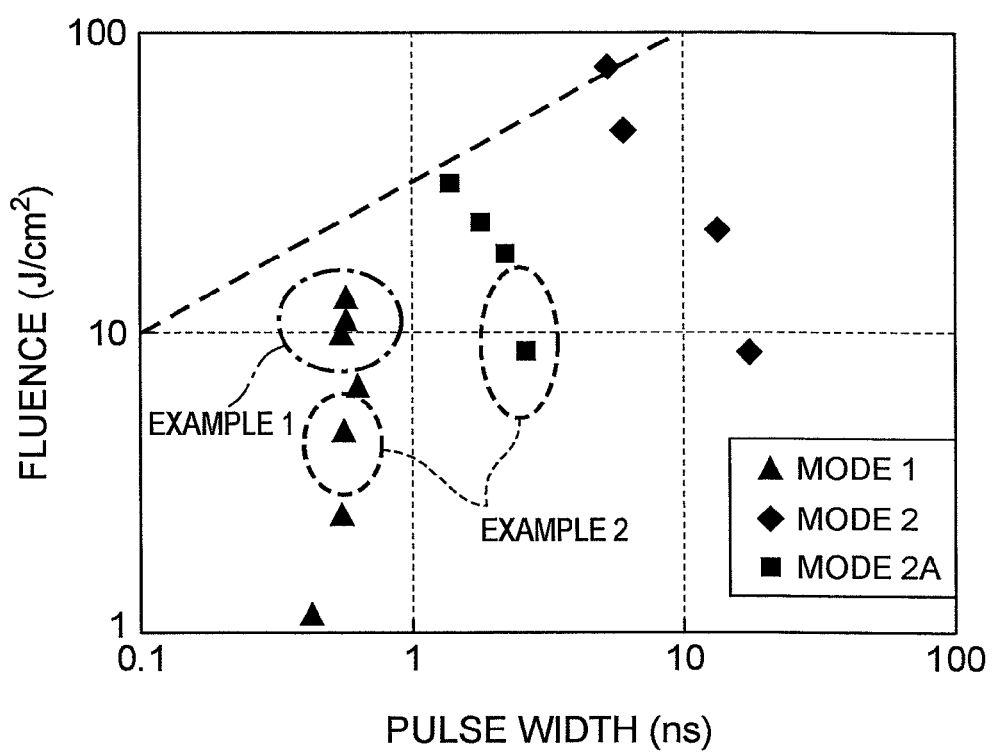
FIG. 13 is a graph showing the relationship between the full width at half maximum of pulse and the fluence per one pulse in each of modes 1 and 2.

FIG. 13 is a graph showing the relationship between the full width at half maximum of pulse and the fluence per one pulse in each of modes 1 and 2. FIG. 13 indicates data of modes 1 and 2 with triangle and diamond signs, respectively. It also indicates data of mode 2A with square signs. With a broken line, FIG. 13 shows the relationship that "the fluence decomposition threshold is proportional to the square root of the pulse width" described in paragraph [0005] in Patent Document 3. As shown in FIG. 13, the fluence per one pulse becomes 13 J/cm$^2$ and 77 J/cm$^2$ in modes 1 and 2, respectively, at the maximum.

Figure 12:
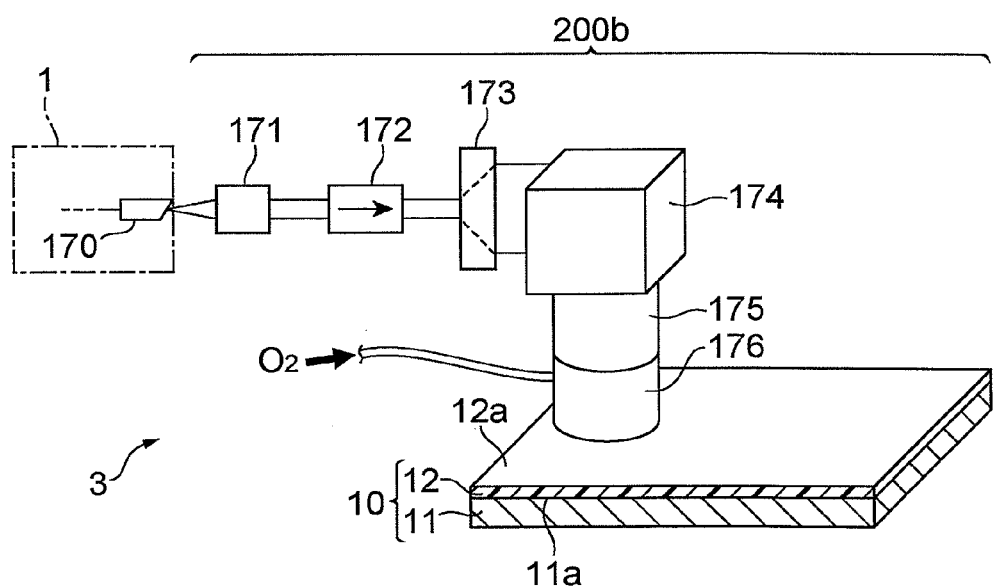
FIG. 12 is a view showing the structure of a third embodiment (third structure) of the laser processing apparatus favorably used in the laser processing method according to the present invention.
Figure 14:
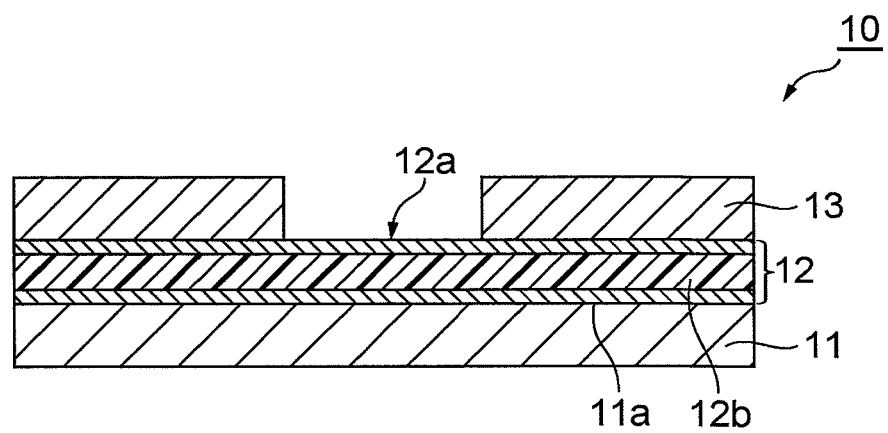
FIG. 14 is a sectional view of a printed board (including a multilayer structure of conductor and insulating layers)
Figure 15:
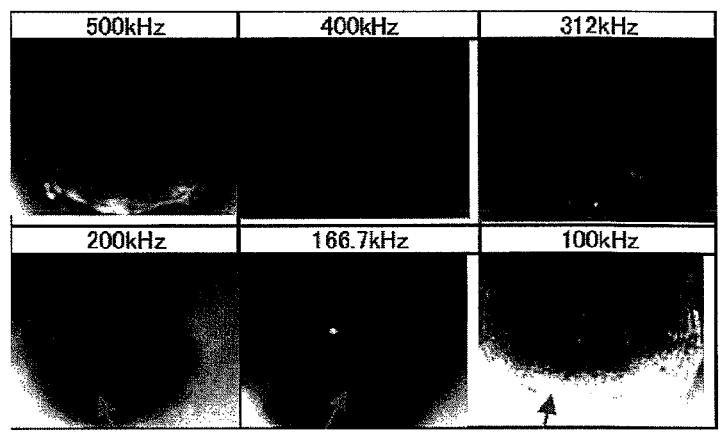
FIG. 15 is a set of photographs observed through an optical microscope and SEM photographs of a via hole when changing the pulse at repetition frequencies of 500, 400, 312.5, 200, 166.7, and 100 kHz in mode 1.
Figure 15:
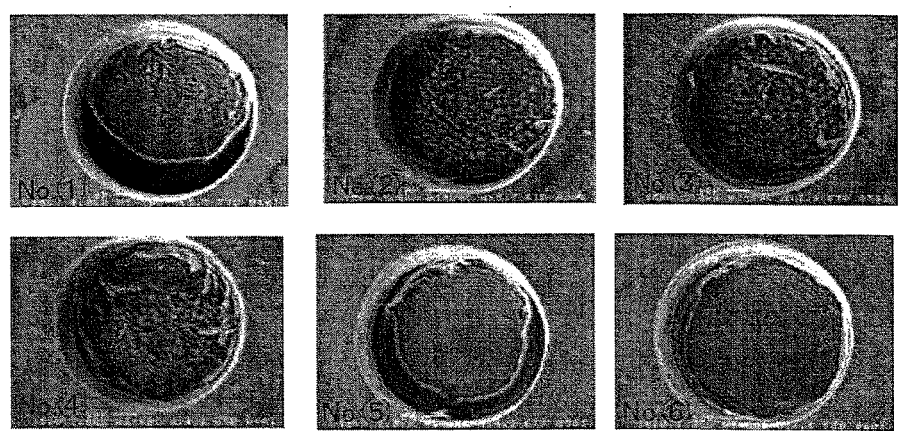
Figure 16:
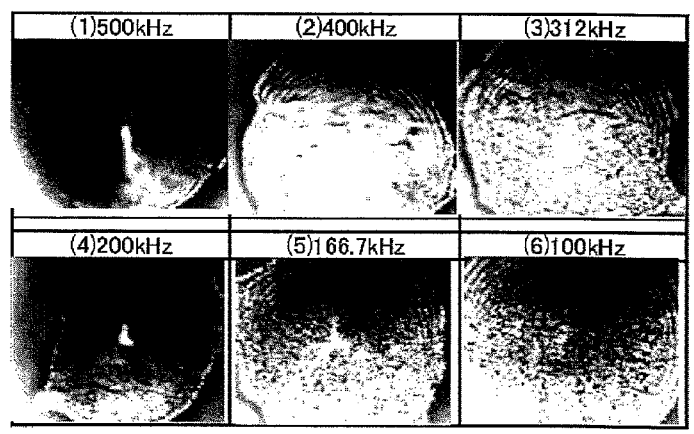
FIG. 16 is a set of photographs observed through the optical microscope and SEM photographs of the via hole when changing the pulse at repetition frequencies of 500, 400, 312.5, 200, 166.7, and 100 kHz in mode 1.
Figure 16:
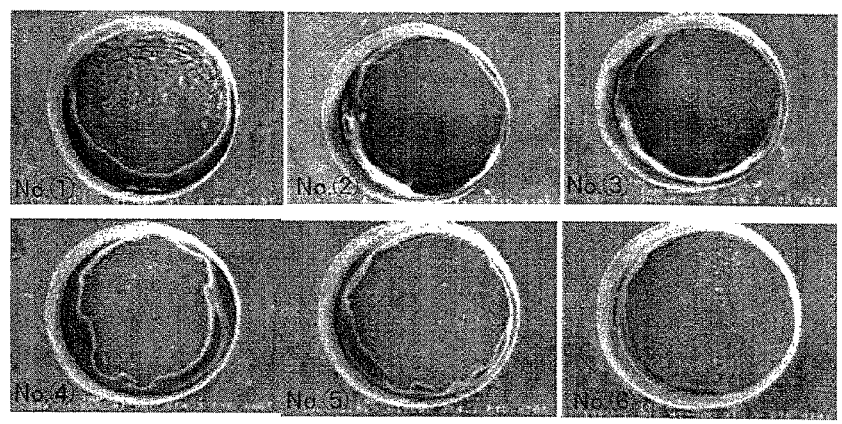

A printed board 10 (corresponding to the object in the area (a) of FIG. 11 and in FIG. 12) having a cross-sectional structure shown in FIG. 14 was irradiated with the pulsed laser light in each of modes 1 and 2 swept at an overlap ratio of 88% at the repetition frequency of 100 kHz, so as to process a via hole. This printed board 10 has a structure in which a copper foil 11 (corresponding to the conductor layer in the area (a) of FIG. 11 and in FIG. 12) having a thickness of 18 μm, a polyimide-based resin layer 12b having a thickness of 14 μm, and a copper foil 13 having a thickness of 18 μm are laminated. The printed board 10 also includes adhesive layers (TPI) for bonding these layers 11, 12b, 13. Therefore, the polyimide-based resin layer 12b and adhesive layers constitute the insulating layer 12 (corresponding to the insulating layer in each area (a) of FIG. 11 and in FIG. 12). The copper foil 13 of the printed board 10 has a hole formed beforehand by chemical processing or laser processing. FIGS. 15 and 16 show the results of via hole processing.

Figure 17:
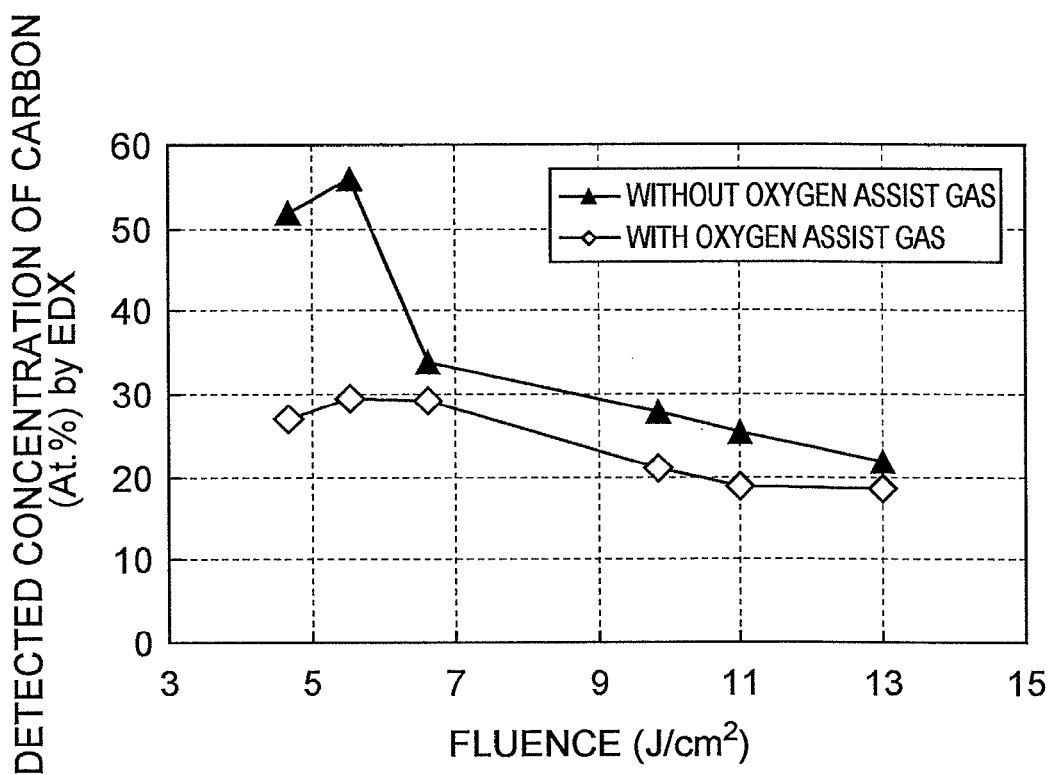
FIG. 17 is a graph showing the relationship between the fluence per one pulse and the detected concentration of carbon remaining in the bottom of the via hole at the above-mentioned repetition frequencies in mode 1.

Each of FIGS. 15 and 16 is a set of photographs observed through an optical microscope and SEM photographs of the via hole when changing the pulse at repetition frequencies of 500, 400, 312.5, 200, 166.7, and 100 kHz in mode 1. In particular, FIG. 15 shows the results obtained by processing in normal air with no assist gas. FIG. 16 shows the results obtained by processing while blowing an oxygen gas as an assist gas. In each of FIGS. 15 and 16, the areas (a) and (b) represent a set of optical micrographs and a set of SEM photographs, respectively. FIG. 17 is a graph showing the relationship between the fluence per one pulse and the detected concentration of carbon remaining in the bottom of the via hole at the above-mentioned repetition frequencies in mode 1. For detecting carbon, an energy-dispersive X-ray fluorescence analyzer (hereinafter referred to as EDX) was used.

Though a residue of about 20 At. % remains upon processing with a UV laser, it can be seen as shown in FIG. 16 that the residue concentration can be suppressed as low as that in the case of the UV laser by using the oxygen gas as an assist gas with a fluence of 10 J/cm$^2$ or greater in mode 1. As shown in FIG. 15, on the other hand, the residue concentration can be suppressed as low as that in the case of the UV laser when the fluence is 13 J/cm$^2$ even without using the oxygen gas as the assist gas. The surface of the conductor layer is hardly removed thereby.

Since the heat generated by pulse laser light irradiation escapes to the conductor layer 11 having a higher coefficient of thermal conductivity as mentioned above (see paragraph [0003] of the present specification), as a condition for succeeding in removing the insulating layer 12, not only the fluence but also the maximum power instantaneously emitted, i.e., the irradiation intensity at a pulse peak, must be taken into consideration in view of smears (processing residues remaining like films or islands on the conductor layer surface). Mode 1 has succeeded in removing the insulating layer 12 at an irradiation intensity of 18 GW/cm$^2$ or greater when using the oxygen assist gas. Even without using the oxygen assist gas, it has succeeded in removing the insulating layer 12 at an irradiation intensity of 24 GW/cm$^2$ or greater. These thresholds of irradiation intensity are deemed to depend on the material and thickness of the conductor layer 11 and the material of the stage on which the conductor layer 11 is placed, whereby predetermined values seem to be necessary according to how the printed board 10 as the object is designed.

In view of the foregoing, not metals and the like having high thermal conductivity, but ceramics, glass, and the like having lower thermal conductivity are desirable as a material for the upper face of the stage on which the printed board 10 is placed.

Figure 19:
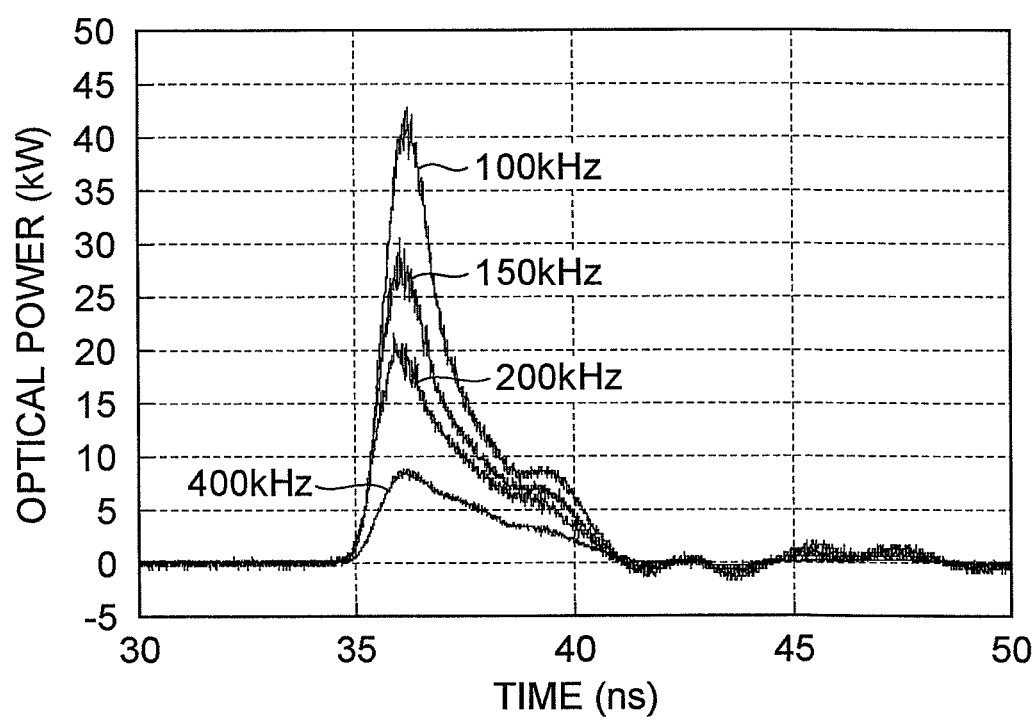
FIG. 19 is a view showing output waveforms in the case where the modulation current of the seed light source has a pulse width of 5 ns in mode 2.

Both the time required for removing the insulating layer 12 and the damage to the conductor layer 11 are expected to be minimized when an area to be removed (processing region AS) is swept with a pulse having a high fluence in mode 2A in FIG. 19 which will be explained later in an initial stage of removing the insulating layer 12 (an initial sweep stage in the case where one beam sweep is carried out within the processing region AS, as shown in the area (b) of FIG. 11) and mode 1 which is excellent in the maximum irradiation intensity while suppressing the fluence is used so as to sweep the beam in the whole processing region AS (removing area) in an end stage of removing the insulating layer 12 (an end sweep stage in the case where one beam sweep is carried out within the processing region AS, as shown in the area (b) of FIG. 11), i.e., the smear removing stage. Though it resembles the method of using both the $CO_2$ laser and UV laser in Patent Document 1, the present invention can process both with a single laser.

Figure 18:
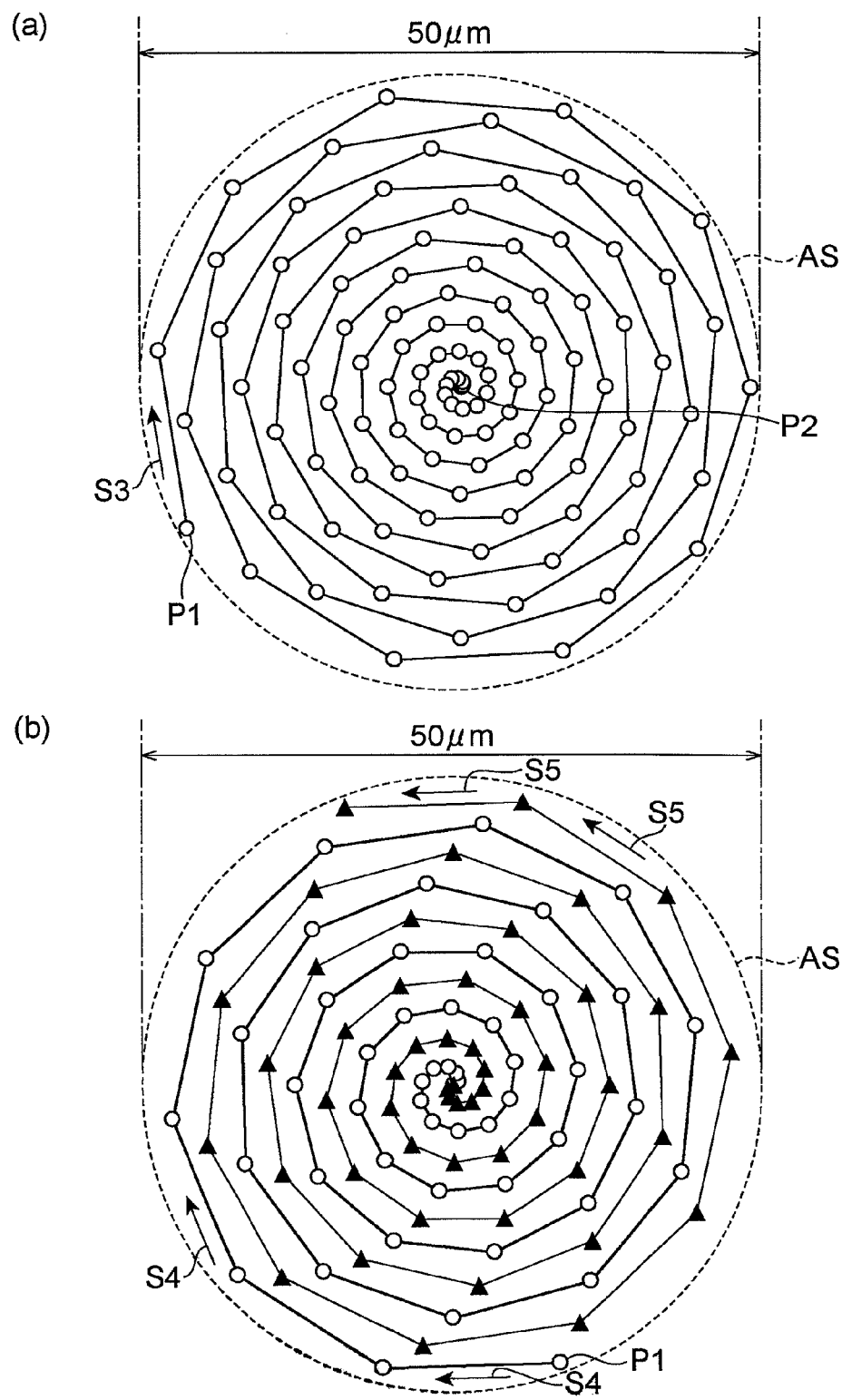
FIG. 18 is a set of views showing an example of sweep patterns of pulsed laser light within a processing region.

FIG. 18 shows an example of beam sweep patterns at this time. Here, the area (a) of FIG. 18 shows an Archimedean spiral beam sweep pattern (corresponding to one beam sweep) proceeding from the sweep start point P1 to a sweep end point P2 (the center of the processing region AS) along a direction indicated by arrow S3 within a hole (a hole, formed beforehand in the conductor layer 13, having a bottom part corresponding to the processing region AS) having a diameter of 50 μm. The distance between centers of irradiation spots closest to the outer periphery is 11 μm, whereby the overlap ratio is about 36% (=(17.3−11)/17.3×100) in view of the fact that the spot diameter is 17.3 μm. On the other hand, the area (b) of FIG. 18 shows a beam sweep pattern in which the first half of one beam sweep from the sweep start point P1 to the sweep end point P2 proceeds from the sweep start point P1 to the center of the processing region AS along a direction indicated by arrow S4, while the second half of the one beam sweep proceeds from the center of the processing region AS to the sweep end point P2 along a direction indicated by arrow S5. The distance between centers of irradiation spots closest to the outer periphery is 7 μm, whereby the overlap ratio is about 59% (=(17.3−7)/17.3×100) in view of the fact that the spot diameter is 17.3 μm.

In the beam sweep pattern in the area (a) of FIG. 18, only the beam sweep in mode 2A which will be explained later is carried out during the period of one beam sweep from the sweep start point P1 to the sweep end point P2. The amount of radial change in the beam sweep pattern in the area (b) of FIG. 18 is twice that in the beam sweep pattern in the area (a) of FIG. 18. In the beam sweep pattern in the area (b) of FIG. 18, the beam is swept in mode 2A in the first half (from the sweep start point P1 to the center of the processing region AS) in one beam sweep and in mode 1 in the second half (from the center of the processing region AS to the sweep end point P2). The number of pulse shots within the processing region AS is 100 in each case.

Returning to FIG. 17 again, the concentration of carbon detected by the EDX was still about 60 At. % even when the repetition frequency was changed within the range of 50 to 500 kHz (i.e., the range of fluence per one pulse of 8 to 77 $J/cm^2$) in mode 2.

As far as the foregoing results of processing and FIG. 13 are compared with each other, the dependence of fluence becoming the LIB threshold upon the pulse width is not the classic relationship in which the fluence decomposition threshold is proportional to the square root of the pulse width as stated in Patent Document 3. Probably, as mentioned in Patent Document 1, the part of the insulating layer 12 in contact with the conductor layer 11 to become a smear is desired to be heated in a concentrated manner in a shorter time, since the heat is easy to escape to the conductor even upon laser irradiation, whereby the above-mentioned discussion of LIB threshold assuming a single material does not seem to be applicable.

In any case, it cannot say that the processing fails to succeed unless the pulse width is 10 ps or shorter as stated in Patent Document 3, but the processing can succeed even when the full width at half maximum of the pulse is about 0.6 nm as shown in FIG. 7, whereby no special pulse compression schemes are necessary in optical amplifying sections such as CPA.

However, each of the polyimide-based resin layer 12b and adhesive layers (which constitute the insulating layer 12 and each may become a smear) may take various compositions, so that there are cases where the insulating layer 12 can be removed even without such a short pulse as that in mode 1. For example, when the modulation current pulse width of the seed light source 100 in mode 2 is 5 ns, its output pulse waveforms are as shown in FIG. 19, whereby the full width at half maximum of the pulse is about 2 ns at repetition frequencies of 100 to 400 kHz. This operation will be referred to as mode 2A in the following.

As a result of via hole processing upon irradiation of a printed board with pulsed laser light through the irradiation optical system 200b of the laser processing apparatus 3 according to the third embodiment using an oxygen gas as an assist gas in mode 2A, the carbon concentration detected by the EDX can be suppressed to about 20 At. % or less (0 At. % in the most favorable case) in an operation region where the repetition frequency is 300 to 800 kHz and relatively high (i.e., the fluence per one pulse is about 10 $J/cm^2$ and thus is low). The surface of the conductor layer is hardly damaged in this case as well.

When the above-mentioned insulating layer was irradiated with a pulse series in mode 1, on the other hand, the carbon concentration detected by the EDX could be reduced to about 20 At. % in the case where the repetition frequency was 300 to 400 kHz (i.e., the fluence per one pulse was about 5 $J/cm^2$ and relatively low).

That is, depending on the material of the insulating layer, there are cases where the fluence per one pulse is desired to be high and where the repetition frequency is desired to be high (at least 300 kHz, i.e., an overlap ratio of 96%) even when the fluence per one pulse is low. As shown in FIG. 11, however, no favorable results could be obtained when the pulse width was 5 ns or longer regardless of the repetition frequency. This seems to be because, as mentioned above, the part of the insulating layer in contact with the conductor to become a smear is desired to be heated in a concentrated manner in a shorter time with a high peak power (a light source output of 10 kW or higher or a power on the object to be processed of 7.5 kW or higher as in FIG. 19), since the heat is easy to escape to the conductor even upon laser irradiation.

FIG. 20 is a set of tables listing relationships among the repetition frequency, pulse width, and fluence in modes 1, 2, and 2A. Particularly, in FIG. 20, the area (a) shows the case of mode 1, the area (b) shows the case of mode 2, and the area (c) shows the case of mode 2A. The areas (a) to (c) of FIG. 20 also list example numbers in the cases having succeeded in processing the insulating layer 12. Examples 1 and 2 are equivalently shown in FIG. 13.

In this embodiment, the selective laser removal of the insulating layer in a printed board constituted by conductor and insulating layers in a wavelength region originally transmittable through the insulating layer or a composite material similar thereto is not limited to the combination of copper and the polyimide-based resin, but favorable selective removable processing can also be achieved when an alloy mainly composed of gold (Au), aluminum (Al), or the like is used as a conductor layer or a plating layer attached to the surface of the conductor layer.

REFERENCE SIGNS LIST 1, 2, 3 . . . laser processing apparatus (laser light source); 200a, 200b . . . illumination optical system; 100 . . . seed light source; 110 . . . YbDF, 111 . . . optical coupler; 112 . . . pumping light source; 113 . . . optical coupler; 114, 115 . . . optical isolator; 120 . . . bandpass filter; 130. . . YbDF; 131 . . . optical coupler; 140 . . . bandpass filter; 150 . . . YbDF; 151 . . . optical coupler; 152 . . . pumping light source; 153 . . . optical coupler; 160 . . . YbDF; 161 . . . combiner; 162 to 166 . . . pumping light source; 167 . . . optical isolator; 170 . . . end cap; 171 . . . collimator; 172 . . . polarization-independent isolator; 173 . . . beam expander; 174 . . . galvano scanner; 175 . . . telecentric fθ lens; and 176 . . . wind tunnel.

The invention claimed is:

1. A laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer;
   wherein a wavelength exhibiting an absorptance of less than 10% with respect to the conductor layer and a reflectance of 70% or more with respect to the insulating layer is selected as a wavelength of the pulsed laser light,
   wherein a fluence per one pulse of the pulsed laser light is set in relation to a tolerable level of a carbon concentration detected on a surface of the conductor layer after removing the insulating layer,
   wherein a repetition frequency of the pulsed laser light is set such that the pulsed laser light has a full width at half maximum of shorter than 5 ns; and
   wherein the predetermined region of the object is irradiated with the pulsed laser light having the selected wavelength, the fluence per one pulse, and the repetition frequency such that the pulsed laser light reaches the conductor layer after passing through the insulating layer.

2. A laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer,
   wherein the predetermined region of the object is irradiated with the pulsed laser light having a selected wavelength exhibiting an absorptance of less than 10% with respect to the conductor layer and a reflectance of 70% of more with respect to the insulating layer such that the pulsed laser light reaches the conductor layer after passing through the insulating layer, and
   wherein the pulsed laser light irradiates a surface of the insulating layer while being swept such that, with respect to a beam spot of the pulsed laser light emitted, a beam spot of the pulsed laser light to be emitted subsequently has an overlap ratio of 40% to 90% on the insulating layer surface.

3. A laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer,
   wherein the predetermined region of the object is irradiated with the pulsed laser light having a selected wavelength exhibiting an absorptance of less than 10% with respect to the conductor layer and a reflectance of 70% or more with respect to the insulating layer such that the pulsed laser light reaches the conductor layer after passing through the insulating layer; and
   wherein the wavelength of the pulsed laser light is a wavelength that can be directly emitted from a laser light source using a photoactive medium containing a rare-earth element.

4. A laser processing method according to claim 3, wherein the photoactive medium is a Yb-doped optical fiber.

5. A laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer,
   wherein the predetermined region of the object is irradiated with the pulsed laser light having a selected wavelength exhibiting an absorptance of less than 10% with respect to the conductor layer and a reflectance of 70% or more with respect to the insulating layer such that the pulsed laser light reaches the conductor layer after passing through the insulating layer, and
   wherein the full width at half maximum of the pulsed laser light is set to such an extent that no processing residue of the insulating layer remains as a film or island on a surface of the conductor layer.

6. A laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer,
   wherein the predetermined region of the object is irradiated with the pulsed laser light having a selected wavelength exhibiting an absoptance of less than 10% with respect to the conductor layer and a reflectance of 70% or more with respect to the insulating layer such that the pulsed laser light reaches the conductor layer after passing through the insulating layer; and
   wherein the full width at half maximum of the pulsed laser light is shorter than 5 ns.

7. A laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer,
   wherein the predetermined region of the object is irradiated with the pulsed laser light having a selected wavelength exhibiting an absorptance of less than 10% with respect to the conductor layer and a reflectance of 70% or more with respect to the insulating layer such that the pulsed laser light reaches the conductor layer after passing through the insulating layer, and wherein the full width at half maximum of the pulsed laser light is longer than 10 ps.

8. A laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer, wherein the predetermined region of the object is irradiated with the pulsed laser light having a selected wavelength exhibiting an absorptance of less than 10% with respect to the conductor layer and a reflectance of 70% or more with respect to the insulating layer such that the pulsed laser light reaches the conductor layer after passing through the insulating layer, and wherein the irradiation intensity at a pulse peak of the pulsed laser light is set to such an extent that no processing residue of the insulating layer remains as a film or island on a surface of the conductor layer.

9. A laser processing apparatus configured to execute a laser processing method comprising the steps of: placing an object, including a conductor layer and an insulating layer which is comprised of a resin and is laminated on the conductor layer, onto an optical path of pulsed laser light; and irradiating the object with the pulsed laser light so as to remove a part of the insulating layer located in a predetermined region on the conductor layer, wherein the predetermined region of the object is irradiated with the pulsed laser light having a selected wavelength exhibiting an absorptance of less than 10% with respect to the conductor layer and a reflectance of 70% or more with respect to the insulating layer such that the pulsed laser light reaches the conductor layer after passing through the insulating layer;

wherein the laser processing apparatus comprises a laser light source for generating the pulsed laser light and an irradiation optical system for sweeping a beam of the pulsed laser light within a processing region on a surface of the insulating layer where the pulsed laser light reaches;

wherein, assuming that a beam sweep traveling from a sweep start point to a sweep end point while drawing a given pattern within the processing region is one unit, the laser light source changes at least one of the pulse width and repetition frequency in conditions for generating the pulsed laser light at least once during a period of the one unit of beam sweep; and wherein the laser light source sets the fluence per one pulse of the pulsed laser light in an initial stage of the beam sweep, including the sweep start point in the one unit of the beam sweep, greater than that in a period subsequent to the initial stage of the beam sweep.

10. A laser processing apparatus according to claim 9, wherein the laser light source sets the irradiation intensity at the pulse peak of the pulsed laser light in an end stage of the beam sweep, including the sweep end point in the one unit of the beam sweep, greater than that at the pulse peak of the pulsed laser light in a period before the end stage of the beam sweep.

11. A laser processing apparatus according to claim 9, wherein the irradiation optical system irradiates the surface of the insulating layer with the pulsed laser light while sweeping the pulsed laser light such that, with respect to a beam spot of the pulsed laser light emitted, a beam spot of the pulsed laser light to be emitted subsequently has an overlap ratio of 40% to 90% on the surface of the insulating layer.

12. A laser processing method according to claim 1, wherein the pulsed laser light irradiates a surface of the insulating layer while being swept such that, with respect to a beam spot of the pulsed laser light emitted, a beam spot of the pulsed laser light to be emitted subsequently has an overlap ratio of 40% to 90% on the insulating layer surface.

13. A laser processing method according to claim 1, wherein the wavelength of the pulsed laser light is a wavelength that can be directly emitted from a laser light source using a photoactive medium containing a rare-earth element.

14. A laser processing method according to claim 13, wherein the photoactive medium is a Yb-doped optical fiber.

15. A laser processing method according to claim 1, wherein the full width at half maximum of the pulsed laser light is set to such an extent that no processing residue of the insulating layer remains as a film or island on a surface of the conductor layer.

16. A laser processing method according to claim 1, wherein the full width at half maximum of the pulsed laser light is longer than 10 ps.

17. A laser processing method according to claim 1, wherein the irradiation intensity at a pulse peak of the pulsed laser light is set to such an extent that no processing residue of the insulating layer remains as a film or island on a surface of the conductor layer.

18. A laser processing apparatus configured to execute a laser processing method according to claim 1;

wherein the laser processing apparatus comprises a laser light source for generating the pulsed laser light and an irradiation optical system for sweeping a beam of the pulsed laser light within a processing region on a surface of the insulating layer where the pulsed laser light reaches;

wherein, assuming that a beam sweep traveling from a sweep start point to a sweep end point while drawing a given pattern within the processing region is one unit, the laser light source changes at least one of the pulse width and repetition frequency in conditions for generating the pulsed laser light at least once during a period of the one unit of beam sweep; and wherein the laser light source sets the fluence per one pulse of the pulsed laser light in an initial stage of the beam sweep, including the sweep start point in the one unit of the beam sweep, greater than that in a period subsequent to the initial stage of the beam sweep.

19. A laser processing apparatus according to claim 18, wherein the laser light source sets the irradiation intensity at the pulse peak of the pulsed laser light in an end stage of the beam sweep, including the sweep end point in the one unit of the beam sweep, greater than that at the pulse peak of the pulsed laser light in a period before the end stage of the beam sweep.

20. A laser processing apparatus according to claim 18, wherein the irradiation optical system irradiates the surface of the insulating layer with the pulsed laser light while sweeping the pulsed laser light such that, with respect to a beam spot of the pulsed laser light emitted, a beam spot of the pulsed laser light to be emitted subsequently has an overlap ratio of 40% to 90% on the surface of the insulating layer.

* * * * *